US010061278B2

(12) United States Patent
Fricke

(10) Patent No.: US 10,061,278 B2
(45) Date of Patent: Aug. 28, 2018

(54) METHOD OF OFF-LINE HYBRID SYSTEM ASSESSMENT FOR TEST MONITORING AND MODIFICATION

(71) Applicant: MTS Systems Corporation, Eden Prairie, MN (US)

(72) Inventor: David M. Fricke, Prior Lake, MN (US)

(73) Assignee: MTS SYSTEMS CORPORATION, Eden Prairie, MN (US)

( * ) Notice: Subject to any disclaimer, the term of this patent is extended or adjusted under 35 U.S.C. 154(b) by 365 days.

(21) Appl. No.: 14/481,670

(22) Filed: Sep. 9, 2014

(65) Prior Publication Data
US 2015/0081045 A1 Mar. 19, 2015

Related U.S. Application Data

(60) Provisional application No. 61/875,665, filed on Sep. 9, 2013.

(51) Int. Cl.
*G05B 13/04* (2006.01)
*G06F 17/50* (2006.01)
*G01M 17/00* (2006.01)

(52) U.S. Cl.
CPC ............. *G05B 13/04* (2013.01); *G01M 17/00* (2013.01); *G06F 17/5009* (2013.01)

(58) Field of Classification Search
CPC .... G05B 13/04; G05B 17/02; G05B 23/0256; G05B 13/024; G05B 19/042;
(Continued)

(56) References Cited

U.S. PATENT DOCUMENTS 3,592,545 A 7/1971 Paine et al.
3,597,967 A 8/1971 Drexler et al.
(Continued)

FOREIGN PATENT DOCUMENTS

CN 102129487 A 7/2011
CN 102227622 A 10/2011
(Continued)

OTHER PUBLICATIONS

International Search Report and Written Opinion for corresponding International application No. PCT/US2014/054797, dated Jan. 16, 2015.
(Continued)

*Primary Examiner* — Kenneth M Lo
*Assistant Examiner* — Mohammed Shafayet
(74) *Attorney, Agent, or Firm* — Steven M. Koehler; Westman, Champlin & Koehler, P.A.

(57) ABSTRACT

A method and an arrangement of controlling simulation of a coupled hybrid dynamic system comprising a component under test and a virtual model includes driving the physical component under test of the system on a test rig over a period of time to conduct a test by applying an initial test drive signal input to the test rig to generate a test rig response. At least a portion of the test rig response is inputted into the virtual model of the system to obtain a model response of the system. A condition of the physical component under test is assessed during at least a portion of the period of time to conduct the test based on comparing another portion of the test rig response with the model response where an output relating to the assessment is recorded or rendered.

20 Claims, 5 Drawing Sheets

(58) Field of Classification Search
CPC ......... G06F 17/5009; G01M 17/0074; G01M 17/00; G01M 13/025; G01N 2203/0208; G01N 3/32
USPC ........................................................ 700/30
See application file for complete search history.

(56) References Cited

U.S. PATENT DOCUMENTS

| | | | |
|---|---|---|---|
| 3,818,751 A | 6/1974 | Karper et al. | |
| 3,939,692 A | 2/1976 | Bollinger | |
| 4,882,677 A | 11/1989 | Curran | |
| 4,916,632 A * | 4/1990 | Doi | B60G 17/018 280/5.515 |
| 5,014,719 A | 5/1991 | McLeod | |
| 5,038,605 A | 8/1991 | Tews | |
| 5,101,660 A | 4/1992 | La Belle | |
| 5,168,750 A | 12/1992 | Kurtz | |
| 5,259,249 A | 11/1993 | Fetto | |
| 5,277,564 A | 1/1994 | DeGroat | |
| 5,369,974 A | 12/1994 | Tsymberov | |
| 5,450,321 A | 1/1995 | Crane | |
| 5,430,645 A * | 7/1995 | Keller | G01P 1/122 324/160 |
| 5,487,301 A | 1/1996 | Ueller et al. | |
| 5,511,431 A * | 4/1996 | Hinton | G01M 5/005 73/805 |
| 5,541,504 A | 7/1996 | Kubo et al. | |
| 5,598,076 A * | 1/1997 | Neubauer | B25J 9/161 318/568.13 |
| 5,602,759 A | 2/1997 | Harashima | |
| 5,821,718 A | 10/1998 | Shaffer | |
| 5,877,414 A * | 3/1999 | Rui | G01M 17/007 73/146 |
| 5,880,362 A | 3/1999 | Tang | |
| 5,936,858 A * | 8/1999 | Arai | G05B 13/04 700/30 |
| 5,937,530 A | 8/1999 | Masson | |
| 5,942,673 A | 8/1999 | Horiuchi | |
| 5,952,582 A * | 9/1999 | Akita | G01N 3/32 73/805 |
| 5,959,215 A | 9/1999 | Ono et al. | |
| 5,999,168 A | 12/1999 | Rosenberg | |
| 6,044,696 A | 4/2000 | Spencer-Smith | |
| 6,105,422 A | 8/2000 | Pollock | |
| 6,134,957 A | 10/2000 | Fricke et al. | |
| 6,141,620 A | 10/2000 | Zyburt | |
| 6,171,812 B1 | 1/2001 | Smith | |
| 6,192,745 B1 | 2/2001 | Tang | |
| 6,234,011 B1 * | 5/2001 | Yamagishi | G01M 17/0072 73/11.06 |
| 6,247,348 B1 | 6/2001 | Yamakado et al. | |
| 6,285,972 B1 * | 9/2001 | Barber | G01M 7/022 318/561 |
| 6,418,392 B1 | 7/2002 | Rust et al. | |
| 6,502,837 B1 | 1/2003 | Hamilton et al. | |
| 6,510,740 B1 | 1/2003 | Behm et al. | |
| 6,538,215 B2 | 3/2003 | Montagnino et al. | |
| 6,571,373 B1 | 5/2003 | Devins et al. | |
| 6,577,973 B1 * | 6/2003 | Freitag | G01M 17/0072 702/85 |
| 6,581,437 B2 | 6/2003 | Chrystall et al. | |
| 6,634,218 B1 | 10/2003 | Nakanishi et al. | |
| 6,715,336 B1 | 4/2004 | Xu | |
| 6,721,922 B1 | 4/2004 | Walters et al. | |
| 6,725,168 B2 | 4/2004 | Shirasi et al. | |
| 6,754,615 B1 * | 6/2004 | Germann | B60C 19/00 701/36 |
| 6,898,542 B2 | 5/2005 | Ott et al. | |
| 6,962,074 B2 | 11/2005 | Lenten et al. | |
| 7,031,949 B2 * | 4/2006 | Lund | F16F 15/02 700/30 |
| 7,058,488 B2 | 6/2006 | Kemp et al. | |
| 7,104,122 B2 | 9/2006 | Kurai et al. | |
| 7,117,137 B1 | 10/2006 | Belcea | |
| 7,146,859 B2 * | 12/2006 | Dittmann | G01M 13/027 73/669 |
| 7,194,888 B1 * | 3/2007 | Temkin | G01M 17/04 73/11.04 |
| 7,257,522 B2 | 8/2007 | Hagiwara et al. | |
| 7,363,805 B2 | 4/2008 | Jayakumar et al. | |
| 7,383,738 B2 | 6/2008 | Schutz | |
| 7,441,465 B2 | 10/2008 | Oliver et al. | |
| 8,135,556 B2 * | 3/2012 | Fricke | G01M 17/0074 700/30 |
| 8,825,460 B2 * | 9/2014 | Walenta | G01M 17/00 703/7 |
| 9,009,013 B2 * | 4/2015 | Krainz | G05B 17/02 703/13 |
| 2001/0045941 A1 | 11/2001 | Rosenberg et al. | |
| 2002/0029610 A1 | 3/2002 | Chrystall et al. | |
| 2002/0134169 A1 | 9/2002 | Takeda et al. | |
| 2002/0170361 A1 | 11/2002 | Vilendrer et al. | |
| 2003/0029247 A1 | 2/2003 | Biedermann et al. | |
| 2003/0033058 A1 * | 2/2003 | Lund | F16F 15/02 701/1 |
| 2003/0183023 A1 | 10/2003 | Kusters | |
| 2004/0019382 A1 | 1/2004 | Amirouche et al. | |
| 2004/0019384 A1 | 1/2004 | Kirking et al. | |
| 2004/0107082 A1 | 6/2004 | Sato et al. | |
| 2004/0255661 A1 * | 12/2004 | Nagai | G01M 17/022 73/146 |
| 2005/0027494 A1 | 2/2005 | Erdogmus | |
| 2005/0050950 A1 * | 3/2005 | Anderson | F23D 11/103 73/114.77 |
| 2005/0120783 A1 | 6/2005 | Narnoun | |
| 2005/0120802 A1 | 6/2005 | Schulz | |
| 2006/0005616 A1 | 1/2006 | Bochkor et al. | |
| 2006/0028005 A1 | 2/2006 | Dell Eva et al. | |
| 2006/0059993 A1 | 3/2006 | Temkin et al. | |
| 2006/0069962 A1 | 3/2006 | Dittmann | |
| 2007/0256484 A1 | 11/2007 | Imanishi et al. | |
| 2007/0260372 A1 * | 11/2007 | Langer | G01M 17/04 701/31.4 |
| 2007/0260373 A1 * | 11/2007 | Langer | G01M 17/007 701/31.4 |
| 2007/0260438 A1 * | 11/2007 | Langer | G01M 17/007 703/8 |
| 2007/0275355 A1 | 11/2007 | Langer et al. | |
| 2008/0271542 A1 | 11/2008 | Schulz | |
| 2008/0275681 A1 * | 11/2008 | Langer | G01M 17/04 703/8 |
| 2008/0275682 A1 * | 11/2008 | Langer | G01M 17/0072 703/8 |
| 2009/0012763 A1 | 1/2009 | Langer et al. | |
| 2010/0088058 A1 * | 4/2010 | Fricke | G01M 17/0074 702/113 |
| 2011/0224959 A1 | 9/2011 | Zhang | G05B 17/02 703/2 |
| 2013/0030751 A1 | 1/2013 | Fricke | |
| 2013/0304441 A1 * | 11/2013 | Fricke | G06F 17/5009 703/6 |
| 2014/0107962 A1 * | 4/2014 | Fricke | G01M 17/0074 702/113 |
| 2015/0134291 A1 * | 5/2015 | Fricke | G01M 17/0074 702/113 |

FOREIGN PATENT DOCUMENTS

| | | |
|---|---|---|
| DE | 2728007 B1 | 8/1978 |
| DE | 4411508 A1 | 10/1995 |
| EP | 0890918 A2 | 1/1999 |
| EP | 0919201 A1 | 6/1999 |
| EP | 1396802 A2 | 3/2004 |
| EP | 1422508 A1 | 5/2004 |
| GB | 2494712 A | 3/2013 |
| JP | H06187030 A | 7/1994 |
| JP | H1020930 A | 1/1998 |
| JP | 2000289417 A | 10/2000 |
| JP | 2009536736 A | 10/2009 |
| JP | 2010-223677 A | 10/2010 |
| JP | 2012504765 A | 2/2012 |

(56) References Cited

FOREIGN PATENT DOCUMENTS

| WO | 9312475 A1 | 6/1993 | | |
|---|---|---|---|---|
| WO | 0023934 A1 | 4/2000 | | |
| WO | 2007133600 A2 | 11/2007 | | |
| WO | 2010039777 A1 | 4/2010 | | |
| WO | WO 2010039777 A1 * | 4/2010 | ........ | G01M 17/0074 |

OTHER PUBLICATIONS

International Search Report and Written Opinion for corresponding International application No. PCT/2014/054789, dated Jan. 12, 2015.
D.W. Clark: "Adaptive control of a materiais-testing machine," 1996, The Institution of Electrical Engineers, pp. 4/1-4/4.
The 858 Mini Bionix II Test System Brochure; mts.com/downloads/300213.01.pdf, pub. 1999.
International Search Report and Written Opinion from the European Patent Office dated Aug. 1, 2014 for corresponding international application No. PCT/US2014/024273, filed Mar. 12, 2014.
Communication from the European Patent Office for European patent application No. 14771483.6, dated Jun. 26, 2017.
Communication from the European Patent Office for European patent application No. 14766646.5, dated Jun. 13, 2017.
Chinese Office Action dated Nov. 13, 2017 for corresponding Chinese Patent Application No. 201480057882.3, filed Sep. 9, 2014.
Chinese Office Action for Chinese Patent Application No. 201480058303.7, dated Jan. 3, 2018.
Japanese Office Action, dated May 22, 2018, for corresponding Japanese Patent Application No. 2016-540924, filed Sep. 23, 2016.

* cited by examiner

METHOD OF OFF-LINE HYBRID SYSTEM ASSESSMENT FOR TEST MONITORING AND MODIFICATION

CROSS-REFERENCE TO RELATED APPLICATIONS

This application claims the benefit of U.S. Provisional Patent Application Ser. No. 61/875,665, filed Sep. 9, 2013, which is incorporated by reference in its entirety.

BACKGROUND

The discussion below is merely provided for general background information and is not intended to be used as an aid in determining the scope of the claimed subject matter.

The present invention is related to U.S. Pat. No. 8,135,556; U.S. Published Patent Application US 2013/0304441A1; and US patent application entitled "Methods and Systems for Testing Coupled Hybrid Dynamic Systems," filed on even date herewith, all of which are hereby incorporated by reference in its entirety.

Generally, the afore-mentioned patent and applications provide arrangements for controlling simulation of a coupled hybrid dynamic system. In one exemplary arrangement, the arrangement comprises a physical test rig configured to drive a physical structural component of the system and to generate a test rig response as a result of applying a drive signal input to the test rig. A processor is configured with a virtual model of the complementary system (herein also referred to as "virtual model") to the physical component (i.e. the virtual model of the complementary system and the physical component comprises the complete hybrid dynamic system). The processor receives a first part of a test rig response as an input and generates a model response of the complementary system using the first part of the received test rig response and a virtual drive as inputs. The processor is further configured to compare a different, second part of the test rig response with the corresponding response from the virtual model of the complementary system to form a difference, the difference being used to form a system dynamic response model which will be used to generate the test rig drive signal.

In an embodiment, the processor is further configured to generate the test drive signal, receive the test rig response, generate a response from the virtual model of the complementary system, and compare the test rig response with the response from the virtual model of the complementary system to generate a hybrid simulation process error. The error is then reduced using an inverse of the system dynamic response model, in an iterative fashion until the difference between the response from the virtual model of the complementary system and the test rig response is below a defined threshold.

The coupled hybrid dynamic system is quite advantageous for testing since the number of physical components is reduced if not minimized. However, further improvements to the system are always desired.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

Generally, some aspects of the invention herein disclosed include continuously monitoring the response of a physical test system with the capability to determine if observed response changes are actually invalid for the degraded components under test. In one particularly advantageous embodiment where the component under test is a physical component, the physical component under test motions and/or forces at the physical/virtual interface locations of a defined hybrid system are monitored and/or recorded. As the test sequence continues the period of time to conduct the test, the set of forces and/or motions are evaluated against the constraint conditions of the virtual elements of the hybrid system (components and defined test environment). For example only, the interface motion time history from the physical component under test is used as a control motion for the adjacent virtual component of the hybrid system, while executing a virtual test event (for example, a vehicle driving sequence, or other simulated vehicle environment, in the case of testing a vehicle component). Generally, a comparison is made at the resulting interface between the virtual system and the physical system. The comparison can be in any suitable domain (e.g. time history, frequency), or portions thereof, where the virtual system is compared to the corresponding measured quantity (e.g. force time history), or portions thereof, from the physical system. If the deviation from the comparison reaches (e.g. is larger than) a pre-defined threshold, the current physical test response can be determined to be invalid relative to its expected behavior as part of the defined hybrid system and an output can be recorded or rendered. If desired, new drive(s) can be calculated and used throughout the period of time to conduct the test.

As used herein "period of time to conduct a test" is using the test rig to assess the physical component under test or other component, element or structure connected thereto. This time period follows possible use of the physical component under test to generate the initial test drive signal, which can be obtained using known techniques such as described in U.S. Pat. No. 8,135,556, which is hereby incorporated by reference in its entirety.

Thus, the present invention allows assessments of the physical component under test in a hybrid dynamic system to be made, for example at 50% or 80% of a component's life in a manner not previously performed. Embodied as a system (arrangement) or a method better replication in the laboratory of the real life environment of the physical component under test can also be provided. In other words, the laboratory testing of the physical component under test can take into account the changing characteristics of the physical component under test as in real life. In the past, laboratory testing either never changed the drive to the rig during testing, or the drive was adjusted to obtain the same responses from the physical component under test that were obtained when the test initially began, but neither of these practices replicate real life testing. However, it should be understood that the correct (e.g. same) test condition for the degraded part might be (and probably would be) a different load and/or motion than what was developed at the hybrid interface when the parts were new, un-tested and/or initially tested. Before the present invention, this was not possible.

Aspects of the invention include a method and an arrangement of controlling simulation of a coupled hybrid dynamic system comprising a physical component under test and a virtual model less the physical component under test. The physical component under test of the system is driven on a test rig over a period of time to conduct a test by applying an initial test drive signal input to the test rig to generate a test rig response. At least a portion of the test rig response is inputted into the virtual model of the system and operable with a processor to obtain a model response of the system. A condition of the physical component under test is assessed during at least a portion of the period of time to conduct the test with the processor that compares another portion of the test rig response with the model response an output relating to the assessment is recorded such as in memory or rendered such as with a display.

A method or arrangement of controlling simulation of a coupled hybrid dynamic system comprising a physical component under test and a virtual model as another aspect of the invention comprises driving the physical component under test of the system on a test rig by applying an initial test drive signal input to the test rig to generate a test rig response. At least a portion of the test rig response is inputted into the virtual model of the system and to obtain a model response of the system. A new test rig drive signal is generated based selectively on comparing another portion of the test rig response with the model response. The test rig drive signal in place of the initial test drive signal input.

One or more of the following features can be combined with the methods and/or the arrangements in further embodiments.

The test rig response can comprise a first component and a second component as a result of applying the initial test drive signal input to the test rig. The processor is configured to receive the first component of the test rig response and generate the model response of the system based on using the first component of the received test rig response and a virtual drive as inputs during the period of time to conduct the test. The said another portion of the test rig response can comprise the second component. The processor is configured to compare the second component of the test rig response with the model response to form a difference, wherein the output is based on the difference.

The processor can be configured to obtain the difference at intermittent intervals or continuously during the period of time to conduct the test.

If desired, in addition to monitoring the actual responses and making a comparison with complementary response(s) from the virtual model, another aspect of the invention includes, if desired, adjusting, and in one embodiment automatically adjusting, the test rig drive during the test sequence to produce new test system responses that are appropriate for the degraded component(s) under test.

In one embodiment, the processor can be configured to generate a new drive signal input to use during the period of time to conduct the test instead of the initial test drive signal input when a parameter based on the difference reaches a selected threshold, which can comprise one or more criteria or measures. If further desired, the processor is configured to repeatedly generate a new drive signal input to use during the period of time to conduct the test when a parameter based on the difference reaches the selected threshold.

The parameter can be the result of the difference of comparing the second component of the test rig response with the model response. In another embodiment, the parameter is based on a rate of change of the difference, which can be measured for all or portion(s) of the period of time to conduct the test.

The processor can be configured to limit an extent of adjustment of a new drive signal with respect to an earlier drive signal. The limit can be based on comparing the drives, comparing associated differences or comparing associated parameters of the differences. The earlier drive signal can be any previous drive signal used by the test rig including the initial test drive signal.

It should be further noted that aspects of the invention can also be used with assessing test components and adjusting drive files in the manner described above with coupled hybrid dynamic systems with virtual inertial element(s) that must appear to track with the other virtual elements by properly responding to the responses obtained from the physical components under test such as described in "Methods and Systems for Testing Coupled Hybrid Dynamic Systems."

DETAILED DESCRIPTION OF THE ILLUSTRATIVE EMBODIMENTS

Figure 1:
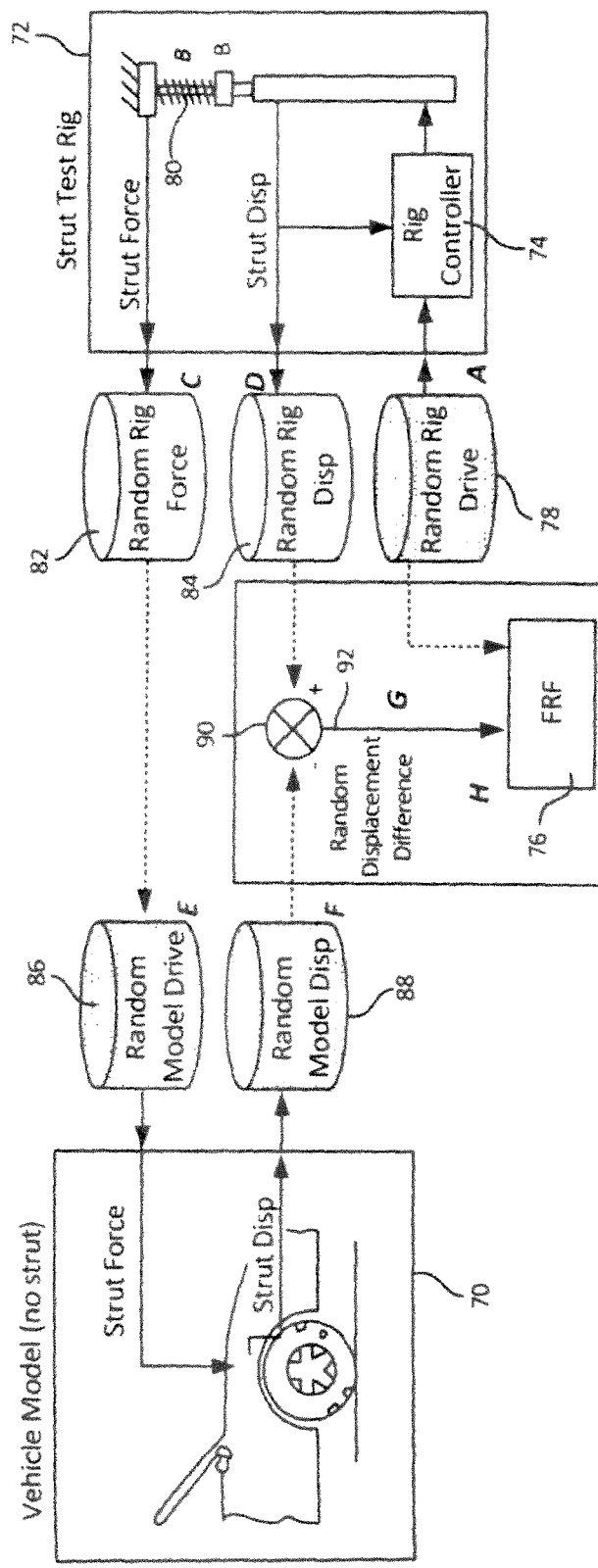
FIG. 1 illustrates an exemplary arrangement for controlling the simulation for a coupled hybrid dynamic system of the prior art.

FIG. 1 depicts an exemplary arrangement for controlling the simulation for a coupled hybrid dynamic system, where it should be understood aspects of the present invention are not limited to the exemplary arrangement herein described, but rather can also be applied to any of the other arrangements in the above-identified patent and patent applications.

In the exemplary arrangement, a complementary vehicle model 70 is typically provided in suitable non-transitory computer readable media such as memory or a hard disk of a computer and accessible by a processor. The model of a vehicle is exemplary only, however, as other systems may be modeled without departing from the present disclosure. Also, for purposes of explanation, the physical component under test is a strut employed in a vehicle suspension system. Other components may be tested, as the strut is an example only of a physical component under test, including but not limited to testing of a complete vehicle less actual tires and wheels as described in the above-identified patent application. A test rig 72 is also provided that accepts drive(s) and provides response(s). In this example, the test rig 72 is configured to test a physical strut mounted within the test rig 72. However, the test rig 72 may be configured to test other structural components. The test rig 72 has a rig controller 74.

The arrangement forms or ascertains a system dynamic response model that can be employed to generate a drive signal used to drive the test rig 72. The system dynamic response model 76 may be a frequency response function (FRF), as one example. The system dynamic response model 76 may also be determined, or calculated, by the same processor on which the model 70 of the complementary is run. However, a system dynamic response model 76 may also be determined and calculated on a separate processor.

FIG. 1 also depicts the arrangement and steps to form the system dynamic response model 76. This can be termed the system response modeling step. This system dynamic response model 76 can be employed in the iterative process of FIG. 2, described later. In FIG. 1, a random test rig drive 78 is played into the test rig 72 that has a component under test 80 (such as a strut) installed. The random test rig drive 78 may be a generic drive, such as a random amplitude, broadband frequency drive. Two responses are measured in the disclosed embodiment although the arrangement is not limited to two responses. One of these responses, such as a random test rig force signal 82, is to be applied to the vehicle model 70 of the complementary system. The other response, such as a random rig displacement 84, is a response to be compared to the response of the virtual model 70 of the complementary system. In the disclosed embodiment of FIG. 1, the first response 82 is the force exerted by the strut on the test rig 72, while the second response 84 is the displacement of the strut 80, which can also be provided as an input to the rig controller 74. It is to be noted that the force and displacement signals are exemplary only, as other response signals may be provided from the test rig 72.

The response from the test rig 72, such as the random rig force 82, is supplied as an input to form a random model drive 86 to the virtual vehicle model 70 of the complementary system. The virtual vehicle model 70 of the complementary system excludes the physical component under test, in this case the strut 80. The virtual vehicle model 70 of the complementary system responds to the random model drive input signal 86 with a random model response signal 88, in this case a displacement.

In the third step of the process, the random response 88 of the virtual model 70 of the complementary system is compared to the associated test rig random response 84. A comparison 90 is performed to form a random response difference 92 (herein by example a displacement). The relationship between the random response difference 92 and the random rig drive 78 establishes the system dynamic response model 76. The system dynamic response model 76 will be inverted and used for test rig drive prediction in the iterative simulation control process of FIG. 2.

Figure 2:
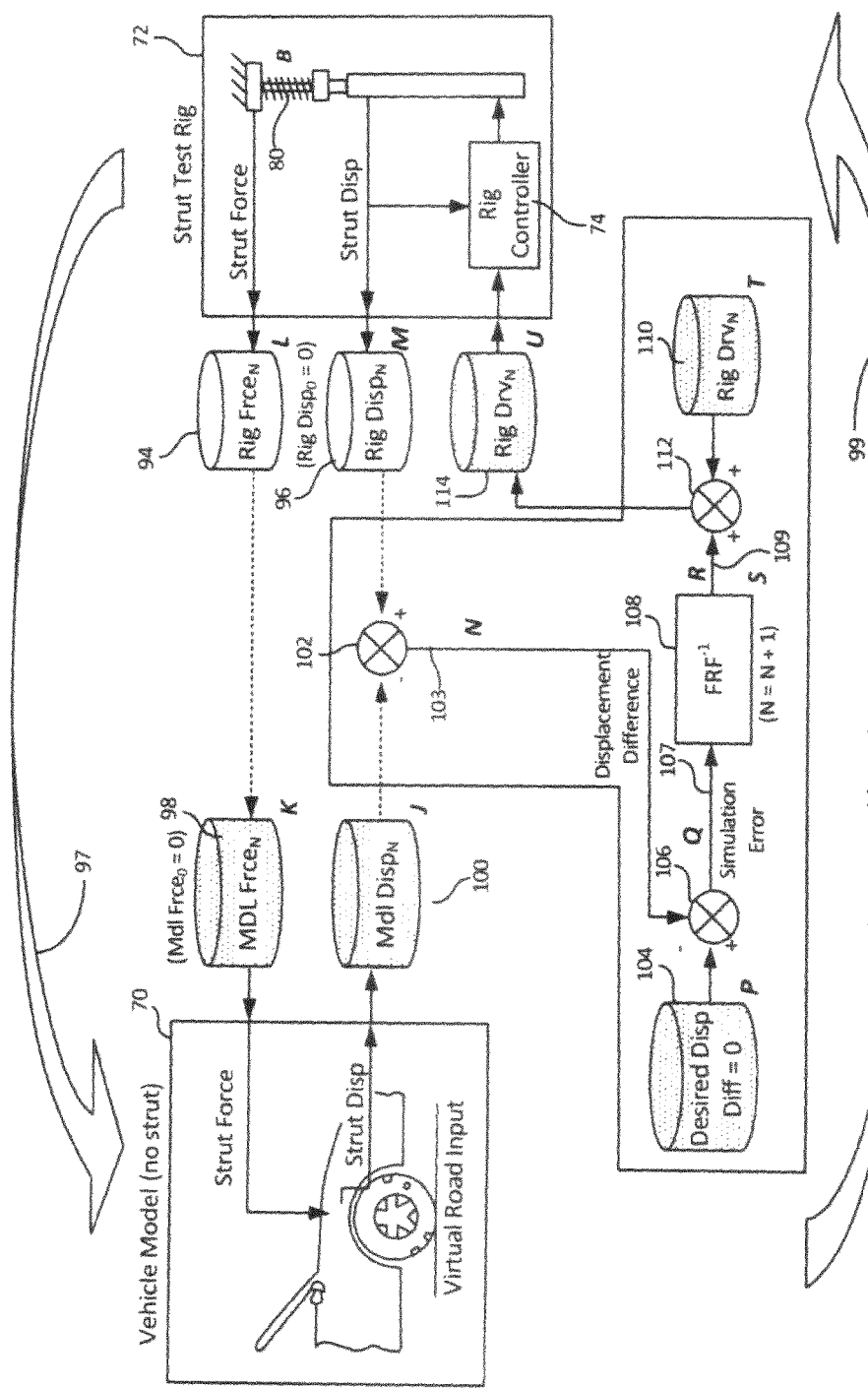
FIG. 2 is a schematic block diagram of an off-line iteration process for obtaining an initial drive for a coupled hybrid dynamic system of the prior art.

The determination of the system dynamic response model 76 may be done in an off-line process, such that high powered and high speed computing capabilities are not required. Further, since there is no need to acquire data, any component can be tested without previous knowledge of how that component is going to respond within a virtual model, or in a physical environment. The off-line measurement of the system dynamic response model 76 measures the sensitivity of the difference in response 88 of the virtual model of the complementary system and rig response 84 to the rig inputs when the component 80 is in the physical system. Once the relationship between rig drive 78 and system response difference 92 has been modeled, an off-line iteration process is performed, as seen in FIG. 2. This may be considered as the test drive development step.

In the iterative process of FIG. 2, which is an off-line iteration, the virtual model 70 of the complementary system, which excludes the physical component under test 80, is operated. In the exemplary embodiment, the virtual model 70 is the complementary system of a virtual vehicle and the physical component under test that is excluded is the strut 80. The virtual vehicle is driven over a test road, to generate a response 100 of the virtual model 70 of the complementary system. As an example, the response 100 may represent a displacement of the strut 80, although since the strut 80 is not actually present, it is really the displacement of the space that would be occupied by the strut 80 that is measured by the response 100. An additional input to the virtual model 70 of the complementary system, in addition to the virtual test road input, is shown as reference numeral 98. The additional model input 98 to the vehicle model 70 of the complementary system is based on the test rig response 94 from the test rig 72. The additional model input 98, such as the force measured at the test rig 72 is applied simultaneously to the vehicle model 70 during testing. For an initial iteration (N=0), the input 98 to the virtual model 70 of the complementary system will typically be at zero.

The response 100 of the virtual model 70 of the complementary system is compared to the test rig response 96 from the test rig 72. This test rig response 96 must also be a displacement, if the response 100 of the virtual model 70 of the complementary system is a displacement. A comparison of 102 is made between the test rig response 96 and the response 100 of the virtual model 70 of the complementary system to form a response difference 103.

The response difference 103, in this case a displacement difference, is compared to a desired difference 104. Typically, the desired difference 104 will be set at zero for an iterative control process. In further embodiments, however, other desired differences may be employed without departing from the scope of the present disclosure.

The comparison 106 between the response difference 103 and the desired difference 104 produces a simulation error 107 used by the inverse (FRF-1) of the system dynamic response model 76 that was previously determined in the steps shown in FIG. 1. The inverse of the system dynamic response model 76 is depicted as reference numeral 108 in FIG. 2. A drive correction 109 is added to the previous test rig drive signal 110 at 112 to generate the next test rig drive signal 114. Typically, the simulation error 107 is reduced by a relaxation gain factor. The relaxation gain factor (or iteration gain) stabilizes the iterative process and trades off rate-of-convergence against iteration overshoot. Furthermore, the iteration gain minimizes the possibility that the physical component under test will be overloaded during the iteration process due to non-linearities present in the physical system. As appreciated by those skilled in the art, the iteration gain can be applied to the drive correction 109, if so desired.

The next test rig drive signal 114 is applied to the test rig 72 and first and second responses 94,96 are measured. The response 94 to be applied to the vehicle model 70 (illustrated by input 98) generates via the processor and the virtual model 70 of the complementary system, a response 100 that is compared to test rig response 96. The process is repeated iteratively (represented by arrows 97 and 99) until the resulting simulation error 107 is reduced to a desired tolerance value.

The processing of the vehicle model 70 and the determination of the final iteration test rig drive signal 114 is capable of being performed within a single processor. However, in certain embodiments, multiple processors may be employed. Also, it should be understood that the process for determining the simulation error 107 and the determination of the test rig drive signal 114 may be performed off-line.

Following the determination of the test rig drive signal 114, the final iteration test rig drive signal 114 (hereinafter referred to as "initial test drive signal") is used in testing of the physical component under test 80, as seen schematically in FIG. 3. The test rig drive signal 114 is an input to the test rig controller 74 that drives the rig 72. A common use of test rig drive signal(s) 114 is/are to apply them in a repeated sequence for many cycles. Hence, performance testing, durability testing and other types of testing may be performed on the physical component under test 80, such as a strut, without the need for a physical vehicle to have been previously measured and tested.

As indicated above, one characteristic of physical test systems which use compensated control is that the control signals are tailored to the initial behavior of the tested components. As the components age, wear or degrade under test, application of the test rig drive signal 114 to the rig 72 will no longer result in the same forces and motions being applied to the component(s) under test. This situation is recognized in industry practice, but subsequent re-compensation of the control signals to reestablish the original forces or motions are typically not performed. This is because the new forces and moments cannot actually be known to be invalid for the degraded system using conventional assessment methods.

Generally, some aspects of the invention herein disclosed include continuously monitoring the response of a physical test system with the capability to determine if observed response changes are actually invalid for the degraded components under test. In one particularly advantageous embodiment where the physical component under test is a physical component, the physical component under test motions and/or forces at the physical/virtual interface locations of a defined hybrid system are monitored and/or recorded. As the test sequence continues the period of time to conduct the test, the set of forces and/or motions are evaluated against the constraint conditions of the virtual elements of the hybrid system (components and defined test environment). For example only, the interface motion time history from the physical component under test is used as a control motion for the adjacent virtual component of the hybrid system, while executing a virtual test event (e.g. vehicle driving sequence, etc.).

Generally, a comparison is made at the resulting interface between the virtual system and the physical system. The comparison can be in any suitable domain (e.g. force time history), or portions thereof, where the virtual system is compared to the corresponding measured quantity (e.g. force time history), or portions thereof, from the physical system. If the deviation from the comparison reaches (e.g. is larger than) a pre-defined threshold, the current physical test response can be determined to be invalid relative to its expected behavior as part of the defined hybrid system and an output can be recorded or rendered. If desired, new drive(s) can be calculated and used throughout the period of time to conduct the test.

Figure 3:
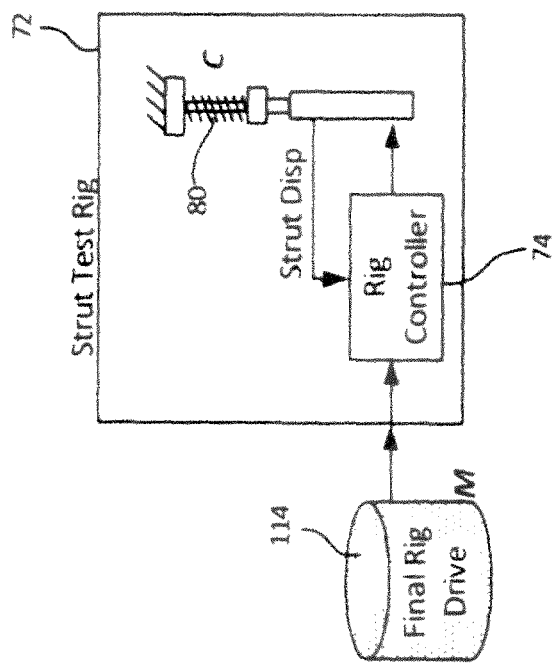
FIG. 3 is a schematic block diagram of testing of test component after obtaining the initial drive.

Referring back to FIG. 2, assume that the final test drive 114 has been determined as described above and that the final test drive 114 is now being used in the test sequence repeatedly to perform testing cycle after cycle in FIG. 3. As indicated above, one aspect includes monitoring the responses 94 and 96, and more importantly, making a comparison using the virtual model 70 to assess the physical component under test 80 over a period of time to conduct a test, which can be performed off-line if desired. In particular, the responses 94 and 96 can be recorded.

Figure 4:
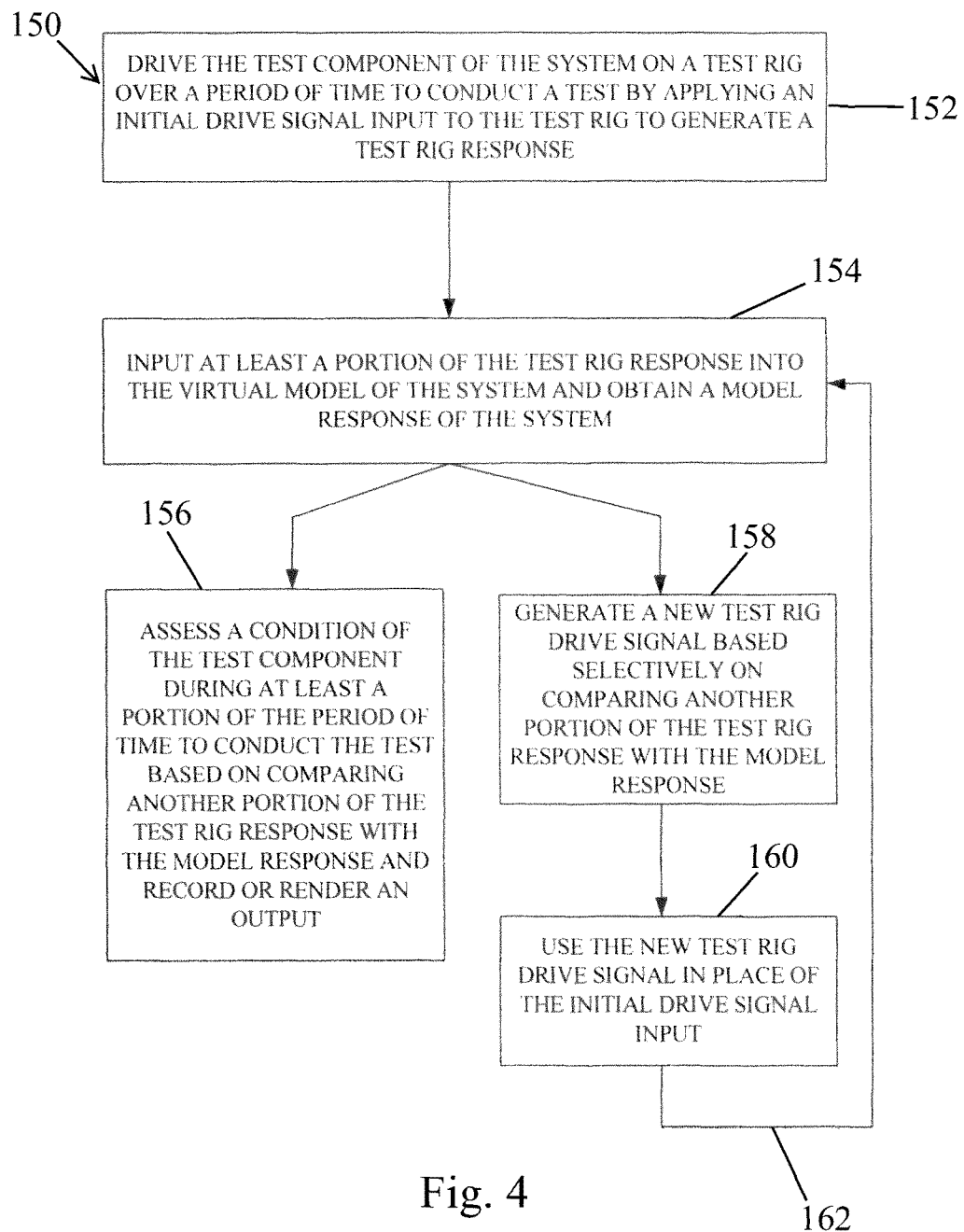
FIG. 4 is a flowchart illustrating controlling simulation of a coupled hybrid dynamic system to assess a condition of a test component and generate new test rig drive signals.

As stated above herein "period of time to conduct a test" is using the test rig to assess the physical component under test 80 or other component, element or structure connected thereto. This time period follows use of the physical component under test 80 to generate the initial test drive signal as discussed above with respect to FIG. 2. Rather, the "period of time" corresponds to operation of the test rig in the manner of FIG. 3. A method of operation is illustrated in FIG. 4 at 150. As illustrated at 152, the physical component under test is driven on the test rig 72 over a period of time to conduct a test by applying the initial test drive signal input to the test rig to generate a test rig response 94,96. At step 154, in a manner similar to that illustrated in FIG. 2, the response 94 is provided to the virtual model 70 as input 98.

At 156, a condition of the physical component under test during at least a portion of the period of time to conduct the test is assessed based on comparing a portion of the test rig response with the model response upon which a corresponding output is recorded record or rendered. The response 100 of the virtual model 70 is compared to the test rig response 96 from the test rig 72. A comparison of 102 is made between the test rig response 96 and the response 100 of the virtual model 70 of the complementary system to form a response difference 103. An output based on the response difference 103 is monitored which can include recording and/or rendering to a user, wherein rendering includes but is not limited to rendering using a printer or monitor device, either proximate the test rig or remote from the test rig.

Although monitoring the responses and making the comparison can be done continuously, it may be sufficient to compare the responses 96 and 100 intermittently, for example, at intervals in the test sequence such as periodic intervals of the period of time to conduct the test. Intermittent comparison may be sufficient since the difference between successive responses (cycles) of the physical system may be quite small, whereas over a period of time or cycles the difference can be more significant.

In addition to monitoring the actual responses and making a comparison with complementary response(s) from the virtual model 70, another aspect of the invention includes, if desired, adjusting, and in one embodiment automatically adjusting, the test rig drive 114 during the test sequence to produce new test system responses that are appropriate for the degraded component(s) under test.

Again referring to FIG. 2, if the response difference 103 reaches a selected threshold, another drive correction 109 can be ascertained and applied to the current drive 114 being used so as to adjust the drive 114 in order to obtain desired responses 94 and 96 from the test rig, for example, similar to that which was present at the beginning of the test sequence. It should be noted the goal is not to make 94 and 96 the same as they originally were, which would not be achievable given that the component has been evaluated to have changed its response. If deviation has been witnessed during monitoring, then both 94 and 96 will have to adjust to the new operating state of the hybrid system.

Generally, as indicated at 158 in FIG. 4, a new test rig drive signal is generated based selectively on comparing a portion of the test rig response with the model response, while the new test rig drive is used in place of the initial test drive signal at 160. In particular, if adjustment of the drive 114 is needed, a comparison 106 between the response difference 103 and the desired difference 104 produces a simulation error 107, which when applied to the inverse (FRF-1) 108 of the system dynamic response model 76 that was previously determined in the steps shown in FIG. 1, a drive correction 109 is obtained. As indicated above, the drive correction 109 is added at 112 to the current test rig drive signal indicated at 110 to generate a new test rig drive signal 114. Because the interface dynamic error as measured by response difference 103 is being evaluated at least occasionally, if not periodically, or even continuously, compensation adjustments of the drive 114 due to normal component under test degradation can occur repeatedly as indicated by loop arrow 162 (which generally illustrates use of a new drive in place of a previous drive) and will typically be small and gradual. In many instances, the drive correction 109 is small such that the desired responses (i.e. hybrid system compatible responses) are then obtained at 94 and 96 in the next test cycle with the new, adjusted test drive 114. However, if upon application of the response 96 with the adjusted drive 114 does not yield a response 100 which when compared to response 96 is within the selected or desired difference, a new drive correction 109 can be again generated and again added to the current drive 110. This may be the case if the simulation error 107 (or drive correction 109) is reduced by a relaxation gain factor; however, use of the relaxation gain factor during the test period is optional.

It should also be noted that another selected threshold can also be used to control or limit the extent of adjustment for each drive correction 109, or a limit with respect to a series of adjustments and/or a limit with respect to the total extent of adjustment from the initial drive used at the beginning of the test sequence. Any or all of these limits can be evaluated during the test period in order to prevent large test control modifications that might occur in the case of a significant change in the test system behavior (e.g. component or test system failure).

Another parameter that can also now be monitored is the rate of change of the difference, which can also be measured by the rate of change of adjustment to the drive for the test system. This parameter may be helpful to the tester in assessing the response of the physical component under test. Also, if the rate of change of the difference or the adjustment has a selected characteristic such as reaching a selected threshold or has a type of pattern indicative of component or test system failure, an alarm or other indication can be provided, or, if desired, the test rig can be shut down.

By making adjustments to the drive 114 during the test sequence, it is now possible to ensure that a component under test that has undergone wear will have an appropriate drive in order that the physical component under test that has undergone wear receives the same test conditions (for example, if the hybrid system is vehicle, the vehicle is driven on the same road) as it received when it initially underwent testing when it was not worn. However, it should be understood that the correct (e.g. same) test condition for the degraded part might be (and probably would be) a different load and/or motion than what was developed at the hybrid interface when the parts were new, un-tested and/or initially tested. Before the present invention, this was not possible.

Thus, a system and method have been provided to better replicate in the laboratory actual testing of a component in its real life environment. In other words for the example provided, the laboratory testing of the strut 80 now better replicates a test where the strut is mounted on a test vehicle and repeatedly driven over a test track. In the past, laboratory testing either never changed the drive to the rig during testing, or the drive was adjusted to obtain the same responses that were obtained when the test initially began, but neither of these practices replicate real life testing. The present invention thus allows new assessments of the physical component under test to be made during its life, for example at 50% or 80% of its life.

Figure 5:
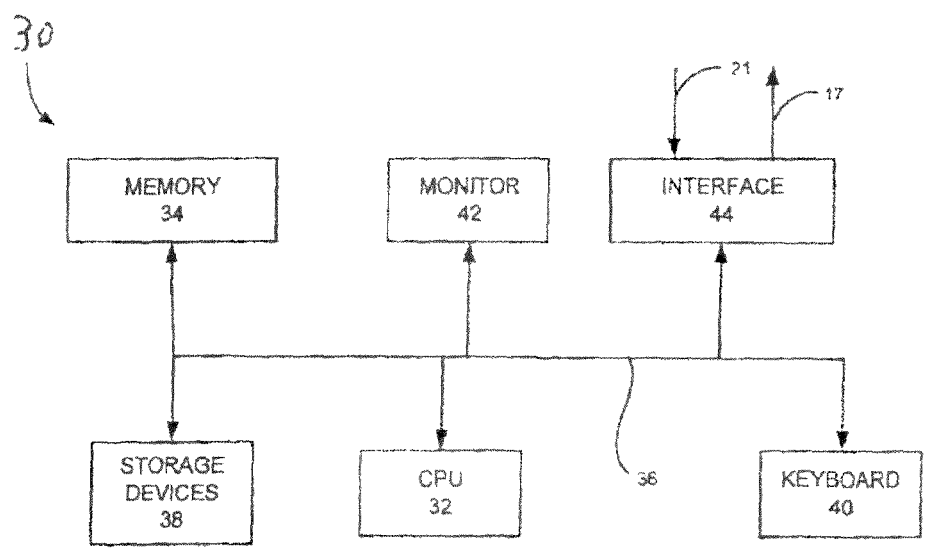
FIG. 5 is a schematic diagram of a suitable computing environment.

FIG. 5 and the related discussion provide a brief, general description of a suitable computing environment in which the invention may be implemented. Although not required, the rig controller as well as the computer performing the processing and storing the models herein were described, at least in part, in the general context of computer-executable instructions, such as program modules, being executed by a computer 30. Generally, program modules include routine programs, objects, components, data structures, etc., which perform particular tasks or implement particular abstract data types. The program modules are illustrated schematically in diagrams indicating data processing. Those skilled in the art can implement the diagrams and data processing to computer-executable instructions stored on non-transitory memory or computer readable media. Moreover, those skilled in the art will appreciate that the invention may be practiced with other computer system configurations, including multi-processor systems, networked personal computers, mini computers, main frame computers, and the like. The invention may also be practiced in distributed computing environments where tasks are performed by remote processing devices that are linked through a communications network. In a distributed computer environment, program modules may be located in both local and remote memory storage devices.

The computer 30 illustrated in FIG. 5 comprises a conventional computer having a central processing unit (CPU) 32, memory 34 and a system bus 36, which couples various system components, including the memory 34 to the CPU 32. The system bus 36 may be any of several types of bus structures including a memory bus or a memory controller, a peripheral bus, and a local bus using any of a variety of bus architectures. The memory 34 includes read only memory (ROM) and random access memory (RAM). A basic input/output (BIOS) containing the basic routine that helps to transfer information between elements within the computer 30, such as during start-up, is stored in ROM. Non-transitory computer readable storage devices 38, such as a hard disk, an optical disk drive, ROM, RAM, flash memory cards, digital video disks etc., are coupled to the system bus 36 and are used for storage of programs and data. Commonly, programs are loaded into memory 34 from at least one of the storage devices 38 with or without accompanying data.

An input device 40 such as a keyboard, pointing device (mouse), or the like, allows the user to provide commands to the computer 30. A monitor 42 or other type of output device is further connected to the system bus 36 via a suitable interface and provides feedback to the user. The desired response 22 can be provided as an input to the computer 30 through a communications link, such as a modem, or through the removable media of the storage devices 38. The drive signals are provided to the test system based on program modules executed by the computer 30 and through a suitable interface 44 coupling the computer 30 to the test system rigs. The interface 44 also receives the responses.

Although the subject matter has been described in language specific to structural features and/or methodological acts, it is to be understood that the subject matter defined in the appended claims is not necessarily limited to the specific features or acts described above as has been held by the courts. Rather, the specific features and acts described above are disclosed as example forms of implementing the claims.

What is claimed is:

1. A system, comprising:
a physical test rig configured to drive a physical component under test on the physical test rig;
a storage device; and
a computer processor operable with the storage device to store a virtual model of the system less the physical component under test, wherein an interface is defined where the physical component interfaces with the virtual model to form a complete system, the processor configured to, prior to conducting a test:
drive the physical test rig and store in the storage device a first portion of a test rig response and a second portion of the test rig response;

apply the first portion of the test rig response to the virtual model and store a response of the virtual model to the first portion of the test rig response and compare the response of the virtual model to the first portion of the test rig response with the second portion of the test rig response so as to form a difference, the difference being used by the processor form a system dynamic response model and store said system dynamic response model in the storage device;

generate a first test drive signal using an inverse of the system dynamic response model; and the processor further configured to, during the test:
drive the physical test rig with the first test drive signal over a first period of time to control the physical test rig and generate a first test rig response of the test;

receive at least a portion of the first test rig response into the virtual model of the system less the physical component under test;

obtain a first model response at the interface of the system resulting from the at least a portion of the first test rig response received;

assess a changing condition of the physical component under test during at least a portion of the first period of time to conduct the test based on comparing another portion of the first test rig response at the interface with the first model response at the interface due to continued application of the first test drive signal input to the physical test rig;

record or render an output corresponding to the changed condition of the physical component under test; and generate a new test drive signal from data corresponding to the assessed changes in the physical component under test and the first test drive signal; and drive the physical test rig over a second period of time subsequent to the first period of time by applying the new test drive signal as input to the physical test rig to generate a second test rig response.

2. The system of claim 1, wherein the first test rig response comprises a first component and a second component as a result of applying the first test drive signal input to the physical test rig;

wherein the computer processor is configured to receive the first component of the first test rig response and generate the first model response at the interface of the system based on using the first component of the first test rig response and a virtual drive as inputs during the first period of time to conduct the test;

wherein said at least a portion of the first test rig response comprises the first component;

wherein said another portion of the first test rig response comprises the second component;

wherein the computer processor is configured to compare the second component of the first test rig response with the first model response at the interface to form a difference; and wherein the output is based on the difference.

3. The system of claim 2, wherein the computer processor is configured to obtain the difference at intermittent intervals during a period of time to conduct the test.

4. The system of claim 2, wherein the computer processor is configured to obtain the difference continuously during the period of time to conduct the test.

5. The system of claim 2, wherein the computer processor is configured to generate the new test drive signal to use to conduct the test instead of the first test drive signal input to the physical test rig when a parameter based on the difference reaches a selected threshold.

6. The system of claim 2, wherein the computer processor is configured to repeatedly generate a new drive signal input to use to conduct the test when a parameter based on the difference reaches a selected threshold.

7. The system of claim 5, wherein the parameter is a result of the difference comparing the second component of the first test rig response with the first model response.

8. The system of claim 5, wherein the parameter is based on a rate of change of the difference.

9. The system of claim 5, wherein the computer processor is configured to limit an extent of adjustment of a later obtained drive signal with respect to an earlier drive signal.

10. The system of claim 9, wherein the computer processor is configured to generate the new test drive signal using the first test drive signal input to the physical test rig.

11. A method of controlling simulation of a coupled hybrid dynamic system comprising a physical component under test in a physical test rig and a virtual model of the system less the physical component under test, the method comprising:

prior to conducting a test, driving the physical test rig and using responses from the virtual model and responses from physical test rig to obtain a system dynamic response model and using the system dynamic response model to obtain an initial test drive signal input;

during a first period of time during an actual test of the physical component, initially driving the physical test rig by applying the initial test drive signal input to the physical test rig to generate a first test rig response;

during the first period of time, through a computer processor,
inputting at least a portion of the first test rig response into the virtual model of the system and obtaining a first model response of the system; and generating a new test rig drive signal based selectively on the initial test drive signal and an output of comparing another portion of the first test rig response with the first model response, wherein the output of the comparison corresponds to changes in the physical component under test; and during a second period of time of the test subsequent to the first period of time, driving the physical test rig by applying the new test rig drive signal as input to the physical test rig to generate a second test rig response of the test.

12. The method of claim 11, wherein the comparing another portion of the first test rig response with the first model response yields a difference.

13. The method of claim 12, wherein the comparing comprises comparing the difference at intermittent intervals over a period of time to conduct the actual test of the physical component.

14. The method of claim 12, wherein the comparing comprises comparing the difference continuously over a period of time to conduct the actual test of the physical component.

15. The method of claim 12, wherein the generating the new test rig drive signal to use is based on a parameter of the difference reaching a selected threshold.

16. The method of claim 12, wherein the generating the new test rig drive signal to use comprises repeatedly generating a new test rig drive signal when a parameter of the difference reaches a selected threshold.

17. The method of claim 15, wherein the parameter is based on a rate of change of the difference.

18. The method of claim 15, wherein the computer processor is configured to limit an extent of adjustment of the new test rig drive signal with respect to an earlier drive signal.

19. The method of claim 18, wherein the generating the new test drive signal includes using the initial test drive signal input.

20. A method of controlling simulation of a coupled hybrid dynamic system comprising a component under test in a physical test rig and a virtual model less a physical component under test, the method comprising:

prior to conducting a test, driving the physical test rig and using responses from the virtual model and responses from physical test rig to obtain a system dynamic response model and using the system dynamic response model to obtain an initial test drive signal input;

after obtaining the initial test drive signal input:

driving the physical component under test of the system on the physical test rig over a first period of time to conduct a test by applying the initial test drive signal input to the physical test rig to generate a first test rig response;

inputting at least a portion of the first test rig response into the virtual model of the system and obtaining a first model response of the system;

identifying a changed condition of the physical component under test during at least a portion of the first period of time to conduct the test based on comparing another portion of the first test rig response with the first model response due to continued application of the initial test drive signal input to the physical test rig;

generating a new test drive signal from data corresponding to the identified changed condition of the physical component under test during the first period of time and the initial test drive signal;

after obtaining the new test drive signal:

further driving the physical component under test of the system on the physical test rig over a second period of time to conduct a second test by applying the new test drive signal as input to the physical test rig to generate a second test rig response;

inputting at least a portion of the second test rig response into the virtual model of the system and obtaining a second model response of the system;

identifying a changed condition of the physical component under test during at least a portion of the second period of time to conduct the test based on comparing another portion of the second test rig response with the second model response due to continued application of the new test drive signal as input to the physical test rig; and generating an updated test drive signal from data corresponding to the identified changed condition of the physical component under test during the second period of time.

* * * * *